(12) United States Patent
Kato et al.

(10) Patent No.: US 11,277,911 B2
(45) Date of Patent: Mar. 15, 2022

(54) CERAMIC COPPER CIRCUIT BOARD AND METHOD FOR MANUFACTURING THE SAME

(71) Applicants: KABUSHIKI KAISHA TOSHIBA, Tokyo (JP); TOSHIBA MATERIALS CO., LTD., Yokohama (JP)

(72) Inventors: Hiromasa Kato, Nagareyama Chiba (JP); Takashi Sano, Fujisawa Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 0 days.

(21) Appl. No.: 17/094,967

(22) Filed: Nov. 11, 2020

(65) Prior Publication Data

US 2021/0068253 A1   Mar. 4, 2021

Related U.S. Application Data

(63) Continuation of application No. PCT/JP2019/019294, filed on May 15, 2019.

(30) Foreign Application Priority Data

May 16, 2018   (JP) .............................. JP2018-094521
Dec. 11, 2018   (JP) .............................. JP2018-231855

(51) Int. Cl.
  *H05K 1/03*   (2006.01)
  *H05K 1/09*   (2006.01)
  *H05K 3/20*   (2006.01)

(52) U.S. Cl.
  CPC .............. *H05K 1/09* (2013.01); *H05K 1/0306* (2013.01); *H05K 3/20* (2013.01); *H05K 2201/0175* (2013.01)

(58) Field of Classification Search
  CPC .......... H05K 1/09; H05K 1/0306; H05K 3/20; H05K 2201/0175; H05K 2203/1476;
  (Continued)

(56) References Cited

U.S. PATENT DOCUMENTS 10,104,775 B2 * 10/2018 Yoshimatsu ........... H05K 3/284
2003/0068532 A1   4/2003 Tsukaguchi et al.
(Continued)

FOREIGN PATENT DOCUMENTS

EP   3492441 A1   6/2019
JP   2003-110205 A   4/2003
(Continued)

OTHER PUBLICATIONS

English Translation JPH10326949 (Year: 1998).*
English Translation WO2017056360 (Year: 2017).*

*Primary Examiner* — Steven T Sawyer
(74) *Attorney, Agent, or Firm* — Harness, Dickey & Pierce, P.L.C.

(57) ABSTRACT

A ceramic copper circuit board according to an embodiment includes a ceramic substrate and a first copper part. The first copper part is bonded at a first surface of the ceramic substrate via a first brazing material part. The thickness of the first copper part is 0.6 mm or more. The side surface of the first copper part includes a first sloped portion. The width of the first sloped portion is not more than 0.5 times the thickness of the first copper part. The first brazing material part includes a first jutting portion jutting from the end portion of the first sloped portion. The length of the first jutting portion is not less than 0 μm and not more than 200 μm. The contact angle between the first jutting portion and the first sloped portion is 65° or less.

8 Claims, 9 Drawing Sheets

(58) Field of Classification Search
CPC .............. H05K 2201/0341; H05K 2201/0338; H05K 3/022; H05K 3/06; H01L 23/49844; H01L 24/00; H01L 23/15; H01L 23/3735
See application file for complete search history.

(56) References Cited

U.S. PATENT DOCUMENTS

| | | | |
|---|---|---|---|
| 2003/0068537 | A1 | 4/2003 | Tsukaguchi et al. |
| 2004/0131832 | A1 | 7/2004 | Tsukaguchi et al. |
| 2014/0291699 | A1* | 10/2014 | Yano .................. H01L 23/3735 257/77 |
| 2015/0049442 | A1 | 2/2015 | Tani et al. |
| 2018/0005918 | A1 | 1/2018 | Naba et al. |
| 2019/0371701 | A1* | 12/2019 | Iwasaki .................. H05K 1/02 |

FOREIGN PATENT DOCUMENTS

| | | |
|---|---|---|
| JP | 2003-112980 A | 4/2003 |
| JP | 2004-172182 A | 6/2004 |
| JP | 2004-307307 A | 11/2004 |
| JP | 2006-228918 A | 8/2006 |
| WO | WO-2017/056360 A1 | 4/2017 |
| WO | WO-2018/021472 A1 | 2/2018 |

* cited by examiner

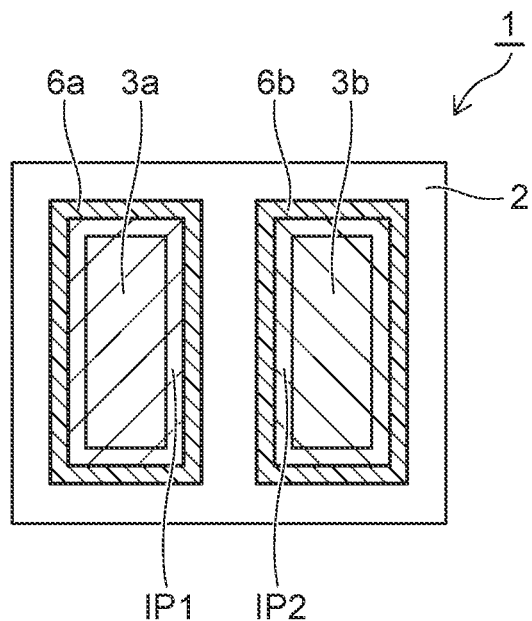
FIG. 7A
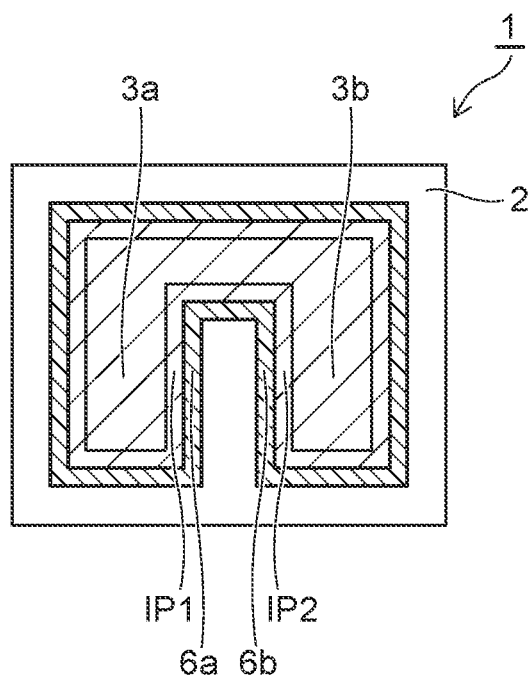
FIG. 7B
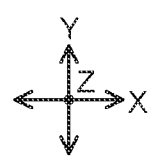

CERAMIC COPPER CIRCUIT BOARD AND METHOD FOR MANUFACTURING THE SAME

CROSS-REFERENCE TO RELATED APPLICATIONS

This is a continuation application of International Patent Application PCT/JP2019/019294, filed on May 15, 2019. This application also claims priority to Japanese Patent Application No. 2018-094521, filed on May 16, 2018, and Japanese Patent Application No. 2018-231855, filed on Dec. 11, 2018. The entire contents of which are incorporated herein by reference.

FIELD

Embodiments described herein relate generally to a ceramic copper circuit board and a method for manufacturing the same.

BACKGROUND

The output of power modules mounted in industrial devices is increasing in recent years with the higher performance of industrial devices. Accordingly, the output is increasing for semiconductor elements. The guaranteed operating temperature of a semiconductor element is about 150° C. The guaranteed operating temperature of some high-performance semiconductor elements has increased to about 175° C.

Accordingly, heat-resistant characteristics are desirable also for ceramic circuit boards on which the semiconductor elements are mounted. The heat-resistant characteristics of a ceramic circuit board are evaluated by a TCT (thermal cycle test). The TCT is a technique that evaluates the durability of the ceramic circuit board in which low temperature→room temperature→high temperature→room temperature is one cycle.

A ceramic copper circuit board that has excellent TCT characteristics is discussed in International Publication No. 2017/056360 (Patent Literature 1). In Patent Literature 1, the TCT characteristics are improved by controlling the length, the height, and the hardness of a jutting portion of a brazing material. Also, in Patent Literature 1, the TCT characteristics are improved by providing a sloped structure in a metal plate side surface.

Power density is an index of the performance of a power module. The power density of a module is determined by power density=VM×IM×n/Mv. VM is the rated withstand voltage (V). IM is the rated current at ΔTj–c=125° C. (A). n is the number of semiconductor elements inside the module. Also, My is the volume (cm3) of the module.

To increase the power density of a power module, it is necessary to increase the number of semiconductor elements inside the module or reduce the volume of the module. Therefore, for a ceramic circuit board, it is desirable to mount more semiconductor elements in a smaller region.

BRIEF DESCRIPTION OF THE DRAWINGS

FIGS. 7A and 7B are schematic plan views showing structure examples of the ceramic copper circuit board;

DETAILED DESCRIPTION

Figure 1:
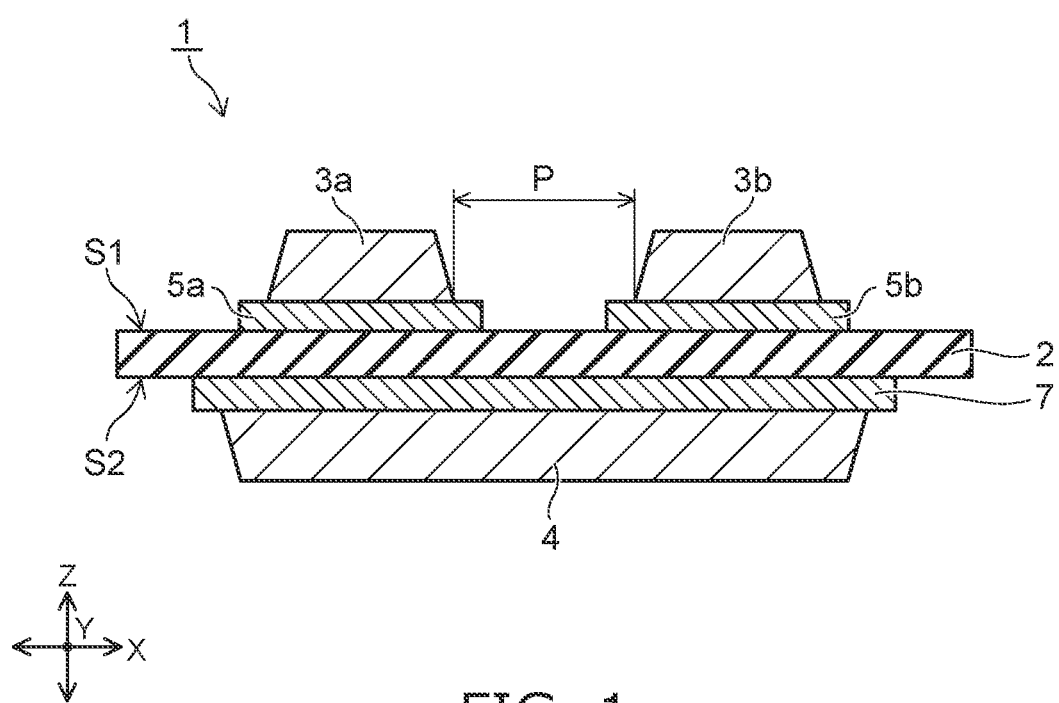
FIG. 1 is a schematic cross-sectional view showing structure example of a ceramic copper circuit board.

A ceramic copper circuit board according to an embodiment includes a ceramic substrate and a first copper part. The first copper part is bonded at a first surface of the ceramic substrate via a first brazing material part. The thickness of the first copper part is 0.6 mm or more. The side surface of the first copper part includes a first sloped portion. The width of the first sloped portion is not more than 0.5 times the thickness of the first copper part. The first brazing material part includes a first jutting portion jutting from the end portion of the first sloped portion. The length of the first jutting portion is not less than 0 μm and not more than 200 μm. The contact angle between the first jutting portion and the first sloped portion is 65° or less.

The drawings are schematic and conceptual; and the relationship between the thickness and width of the portions, the proportions of sizes among portions, etc., are not necessarily the same as the actual values. Furthermore, the dimensions and proportions may be illustrated differently among drawings, even for identical portions.

In the specification and drawings, components similar to those described previously are marked with the same reference numerals, and a detailed description is omitted as appropriate.

Figure 2:
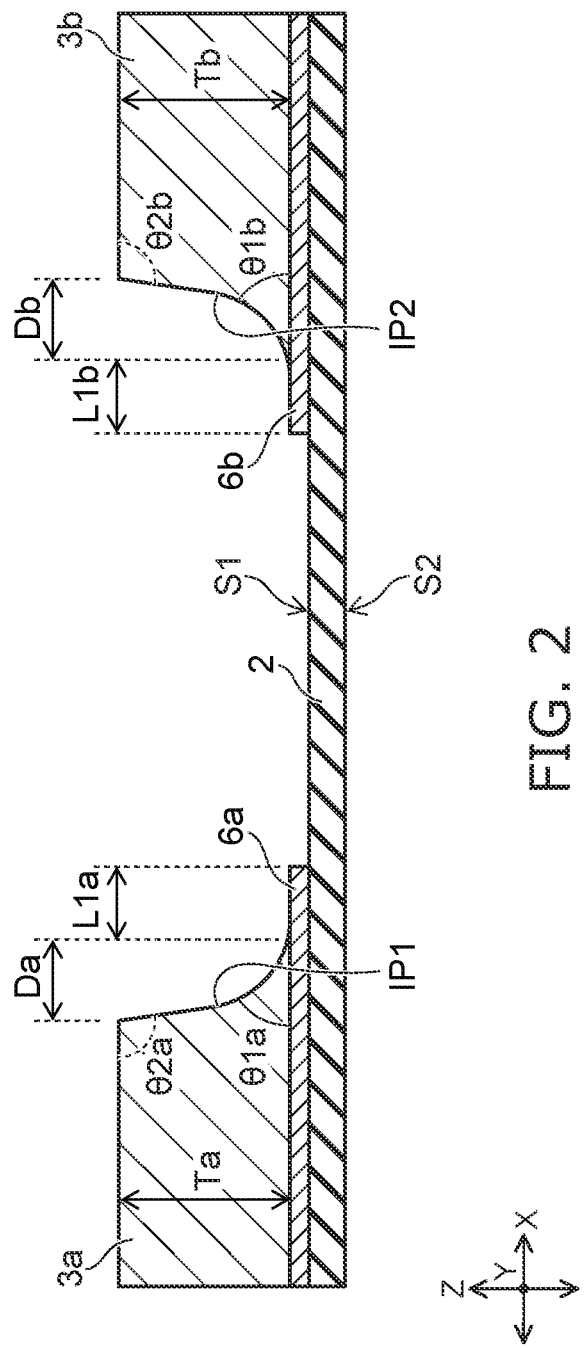
FIG. 2 is a schematic cross-sectional view showing a structure example of side surface shapes of a first copper part and a second copper part.

FIGS. 1 and 2 show a structure example of the ceramic copper circuit board according to the embodiment. FIG. 1 is a schematic cross-sectional view showing the structure example of the ceramic copper circuit board. FIG. 2 is a schematic cross-sectional view showing a structure example of the side surface shapes of the first copper part and the second copper part.

In FIGS. 1 and 2, 1 is a ceramic copper circuit board, and 2 is a ceramic substrate. 3a is a first copper part, and 3b is a second copper part. 4 is a back copper plate. 5a is a first brazing material part, and 5b is a second brazing material part. 6a is a first jutting portion included in a first brazing material part, and 6b is a second jutting portion included in a second brazing material part. 7 is a brazing material layer (a back copper plate-side brazing material layer). Also, P is the distance between the first copper part and the second copper part. Ta is the thickness of the first copper part. IP1 is a first sloped portion included in the side surface of the first copper part. Da is the width of the first sloped portion. L1a is the length of the first jutting portion. θ1a is the contact angle between the first jutting portion and the first sloped portion. θ2a is the angle of the upper end portion of the first sloped portion. Tb is the thickness of the second copper part. IP2 is a second sloped portion included in the side surface of the second copper part. Db is the width of the second sloped portion. L1b is the length of the second jutting portion. θ1b is the contact angle between the second jutting portion and the second sloped portion. θ2b is the angle of the upper end portion of the second sloped portion. L2 is the length of the removal region. The first copper part and the second copper part are portions of the circuit pattern. The back copper plate is provided as a heat dissipation plate. The ceramic copper circuit board according to the embodiment is not limited to the illustrated configurations. For example, the ceramic copper circuit board may include three or more copper parts. The back copper plate may be used as a circuit in the ceramic copper circuit board. The first copper part and the second copper part may be separate copper plates or may be one portion of one copper plate. The shapes of the first copper part and the second copper part when viewed from above may be various shapes such as square, rectangular, U-shaped, L-shaped, H-shaped, etc.

The ceramic copper circuit board includes a ceramic substrate, a brazing material part, and a copper part. The copper part is bonded to the ceramic substrate via the brazing material part. For example, as shown in FIG. 1, the ceramic substrate 2 includes a first surface S1 and a second surface S2. The first copper part 3a is bonded to the first surface S1 via the first brazing material part 5a. The second copper part 3b is bonded to the first surface S1 via the second brazing material part 5b. The copper plate 4 is bonded to the second surface S2 via the brazing material layer 7.

An XYZ orthogonal coordinate system is used in the description of the embodiments. A direction connecting the first surface S1 and the second surface S2 is taken as a Z-direction. Two mutually-orthogonal directions perpendicular to the Z-direction are taken as an X-direction and a Y-direction. The length L1a is the length in the X-direction or the Y-direction of the first jutting portion. The distance P is the distance in the X-direction or the Y-direction between the first copper part and the second copper part. The thickness of each component is the length in the Z-direction of the component.

A silicon nitride substrate, an aluminum nitride substrate, an alumina substrate, a zirconia-including alumina substrate, etc., can be used as the ceramic substrate 2. It is favorable for the three-point bending strength of the ceramic substrate 2 to be 500 MPa or more. Some aluminum nitride substrates, some alumina substrates, and some zirconia-including alumina substrates have three-point bending strengths of 500 MPa or less. Conversely, silicon nitride substrates have high three-point bending strengths of 500 MPa or more and even 600 MPa or more. When the strength of the ceramic substrate is high, the TCT characteristics can be improved even when the thickness Ta and the thickness Tb are set to be thick and are 0.6 mm or more, and even 0.8 mm or more. For example, the three-point bending strength is measured according to JIS-R-1601 (2008). JIS-R-1601 corresponds to ISO 14704 (2000).

The silicon nitride substrate has a thermal conductivity of 50 W/(m·K) or more, or even 80 W/(m·K) or more. For example, the thermal conductivity is measured according to JIS-R-1611 (2010). The JIS-R-1611 corresponds to ISO 18755 (2005). In recent years, silicon nitride substrates have both a high strength and a high thermal conductivity. If the silicon nitride substrate has a three-point bending strength of 500 MPa or more and a thermal conductivity of 80 W/(m·K) or more, the thickness of the ceramic substrate 2 can be thin, i.e., 0.40 mm or less, and even 0.30 mm or less.

Also, aluminum nitride substrates have high thermal conductivity, i.e., a thermal conductivity of 170 W/(m·K) or more. Because aluminum nitride substrates have high thermal conductivities but low strengths, it is desirable for the substrate thickness to be 0.635 mm or more. Also, alumina substrates and zirconia-including alumina substrates have thermal conductivities of about 20 W/(m·K), but are inexpensive. Also, because the strength is low, a substrate thickness of 0.635 mm is necessary. Zirconia-including alumina substrates are also called Alusil substrates.

The thickness Ta of the first copper part and the thickness Tb of the second copper part are 0.6 mm or more. It is favorable for the thickness Ta and the thickness Tb to be 0.8 mm or more. The current-carrying capacity and the heat dissipation can be improved by setting the copper parts to be thick. The thickness of the first copper part and the thickness of the second copper part may be equal to or different from the thickness of the back copper plate 4. When the thickness of the first copper part and the thickness of the second copper part are equal to the thickness of the back copper plate 4, the warp amount of the bonded body of the bonding process can be reduced. The number and size of the copper parts provided at the first surface S1 side of the ceramic substrate 2 are arbitrary.

The first copper part 3a and the second copper part 3b are bonded to the ceramic substrate 2 respectively via the first brazing material part 5a and the second brazing material part 5b. It is favorable for the first brazing material part and the second brazing material part to include Ag (silver), Cu (copper), and an active metal. The active metal is at least one element selected from Ti (titanium), Hf (hafnium), Zr (zirconium), or Nb (niobium). A bonding technique that uses a brazing material including Ag, Cu, and an active metal is called active metal bonding.

It is favorable for the active metal to include Ti (titanium). The Ti can increase the bonding strength by forming titanium nitride (TiN) by reacting with a nitrogen ceramic. Also, the Ti can increase the bonding strength by forming titanium oxide (TiO2) by reacting with an oxide ceramic. Thus, Ti has good reactivity with the ceramic substrate and can increase the bonding strength.

Also, it is favorable for each brazing material part to further include at least one element selected from In (indium), Sn (tin), and C (carbon).

When Ag+Cu+active metal=100 mass %, it is favorable to be within the ranges of a content ratio of Ag of 40 to 80 mass %, a content ratio of Cu of 15 to 45 mass %, and a content ratio of Ti of 1 to 12 mass %. Also, when In and Sn are added, it is favorable for the content ratio of at least one element selected from In or Sn to be in the range of 5 to 20 mass %. When C is added, it is favorable for the content ratio of C to be in the range of 0.1 to 2 mass %. That is, when Ag+Cu+Ti+Sn (or In)+C=100 mass %, it is favorable to be within the ranges of 40 to 73.9 mass % of Ag, 15 to 45 mass % of Cu, 1 to 12 mass % of Ti, 5 to 20 mass % of Sn (or In), and 0.1 to 2 mass % of C. Here, the composition of a brazing material that uses Ti is described, but a portion or all of the Ti may be replaced with another active metal. Also, when both In and Sn are used as well, it is favorable for the total content to be in the range of 5 to 20 mass %.

As described above, the ceramic copper circuit board has a structure in which a copper part is bonded to a ceramic substrate via a brazing material part.

The thickness of the first copper part and the thickness of the second copper part are 0.6 mm or more. The side surface of the first copper part includes the first sloped portion. The side surface of the second copper part includes the second sloped portion. The first sloped portion and the second sloped portion are sloped with respect to the Z-direction. The width Da of the first sloped portion satisfies Da≤0.5Ta. The width Db of the second sloped portion satisfies Db≤0.5Tb. In other words, the width Da and the width Db are lengths in the X-direction or the Y-direction. For example, the first sloped portion and the second sloped portion face each other in the X-direction. The length in the X-direction of the first sloped portion is not more than 0.5 times the thickness (the length in the Z-direction) of the first copper part. The length in the X-direction of the second sloped portion is not more than 0.5 times the thickness of the second copper part.

For example, the upper end of the first sloped portion is continuous with the upper surface of the first copper part. The lower end of the first sloped portion contacts the first brazing material part 5a (the first jutting portion 6a). The upper end of the second sloped portion is continuous with the upper surface of the second copper part. The lower end of the second sloped portion contacts the second brazing material part 5b (the second jutting portion 6b). The width of each sloped portion is the dimension in a direction parallel to the first surface S1 from the upper end of the sloped portion to the location where the sloped portion and the jutting portion contact. The width of each sloped portion can be measured by observing the cross section of the ceramic copper circuit board. Also, the width of each sloped portion can be determined by observing the ceramic copper circuit board from above.

By providing a sloped portion in the side surface of each copper part, the thermal stress of the ceramic copper circuit board can be relaxed. On the other hand, a semiconductor element cannot be mounted to the sloped portion. Although the thermal stress can be relaxed when the width of the sloped portion is wide, the surface area for mounting the semiconductor element becomes small. Therefore, it is favorable for the width of the sloped portion to be not more than 0.5 times the thickness of the copper part. More favorably, the width of the sloped portion is not less than 0.1 times and not more than 0.5 times the thickness of the copper part. When the width of the sloped portion is less than 0.1 times the thickness of the copper part, there is a possibility that the stress relieving effect may be insufficient because the width of the sloped portion is narrow.

The first brazing material part includes the first jutting portion that juts from the end portion of the first copper part. The length L1a of the first jutting portion is not less than 0 μm and not more than 200 μm. The second brazing material part includes the second jutting portion that juts from the end portion of the second copper part. The length L1b of the second jutting portion is not less than 0 μm and not more than 200 μm. The thermal stress can be relaxed by causing a portion of the brazing material part to jut from the end portion of the copper part. Also, it is favorable for the length of each jutting portion to be not less than 0 μm and not more than 200 μm. More favorably, the length of each jutting portion is not less than 10 μm and not more than 100 μm. When the length of each jutting portion is greater than 200 μm, the relaxation of the thermal stress is effective, but it is not easy to make the spacing P between the first copper part and the second copper part narrow. When the length of each jutting portion is 200 μm or less, the spacing P between the first copper part and the second copper part can be 2 mm or less, and even 1.5 mm or less.

Also, when the length of each jutting portion becomes less than 0 μm, a state occurs in which the end portion of the brazing material is positioned further inward than the end portion of the copper part. The thermal stress relaxation effect is not obtained for such a shape. Also, it is favorable for the thickness of each brazing material part to be within the range of 10 to 60 μm.

For example, as illustrated in FIG. 2, the first jutting portion 6a is positioned between the first brazing material part 5a and the second jutting portion 6b in the X-direction. The second jutting portion 6b is positioned between the second brazing material part 5b and the first jutting portion 6a in the X-direction. The length in the X-direction of the first jutting portion 6a is not less than 0 μm and not more than 200 jam. The length in the X-direction of the second jutting portion 6b is not less than 0 μm and not more than 200 μm. To further relax the thermal stress, it is desirable for the length in the X-direction of the first jutting portion 6a to be greater than 0 μm and not more than 200 μm. It is desirable for the length in the X-direction of the second jutting portion 6b to be greater than 0 μm and not more than 200 μm.

The contact angle θ1a between the first jutting portion and the first sloped portion is 65° or less. The contact angle θ1b between the second jutting portion and the second sloped portion is 65° or less. By setting the contact angles θ1a and θ1b to be 65° or less, the relaxation effect of the thermal stress becomes large. More favorably, the contact angles θ1a and θ1b are not less than 5° and not more than 60°.

The length L1a of the first jutting portion, the length L1b of the second jutting portion, the contact angle θ1a, and the contact angle θ1b are measured using a SEM photograph of a cross section of the ceramic copper circuit board passing through the first sloped portion, the second sloped portion, the first jutting portion, and the second jutting portion. The magnification of the SEM photograph is set to 100 times. Each contact angle and the length of each jutting portion are measured from the SEM photograph. This operation is performed for four different cross sections, and the average values are used as each contact angle and the length of each jutting portion. It is favorable to use image analysis software to perform shape recognition of the jutting portion, the sloped portion, etc., in the SEM photograph.

When the shape of the copper plate when viewed from above is rectangular and the first sloped portion is provided in each side surface, it is favorable to measure positions that face each other. For example, when the copper plate is rectangular, a total of four locations are measured at opposing positions at the long sides and opposing positions at the short sides. Also, when multiple copper plates are bonded to one surface of the ceramic substrate, each of the copper plates is measured. It is most favorable for each measurement result to satisfy the ranges described above.

According to the ceramic copper circuit board according to the embodiment, by controlling the width of each sloped portion, the length of each jutting portion, and each contact angle, the thermal stress can be relaxed while ensuring the surface area where the semiconductor elements are mounted. Therefore, the power density of the semiconductor module can be increased.

Figure 3:
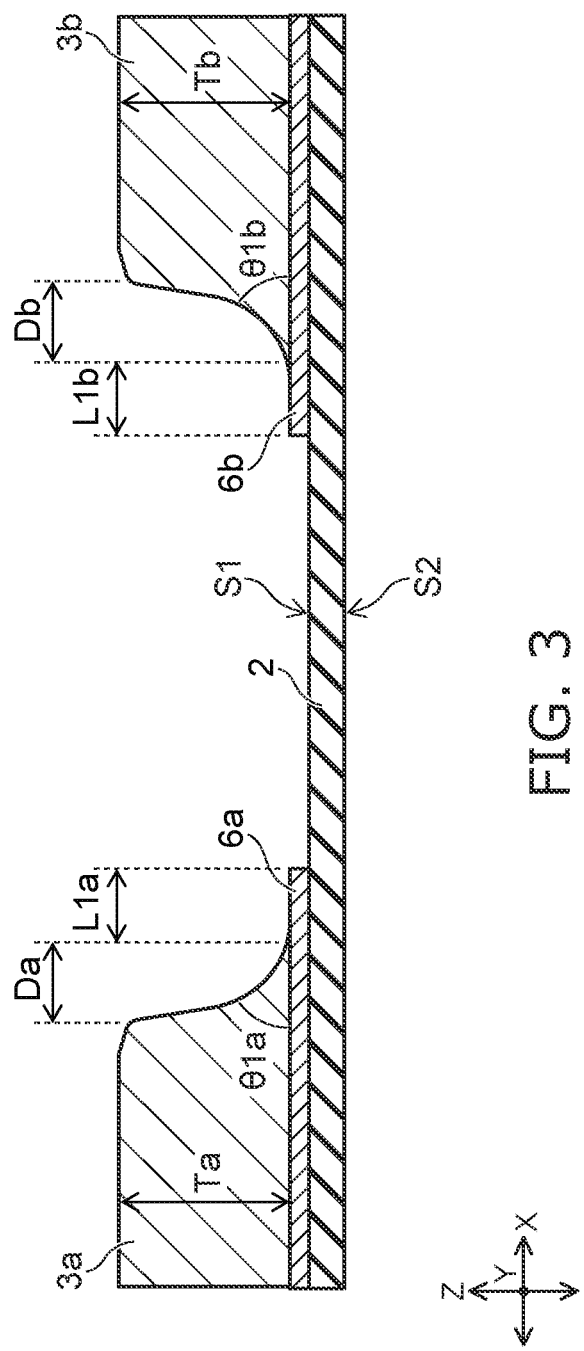
FIG. 3 is a schematic cross-sectional view showing another structure example of the side surface shapes of the first copper part and the second copper part.
Figure 4:
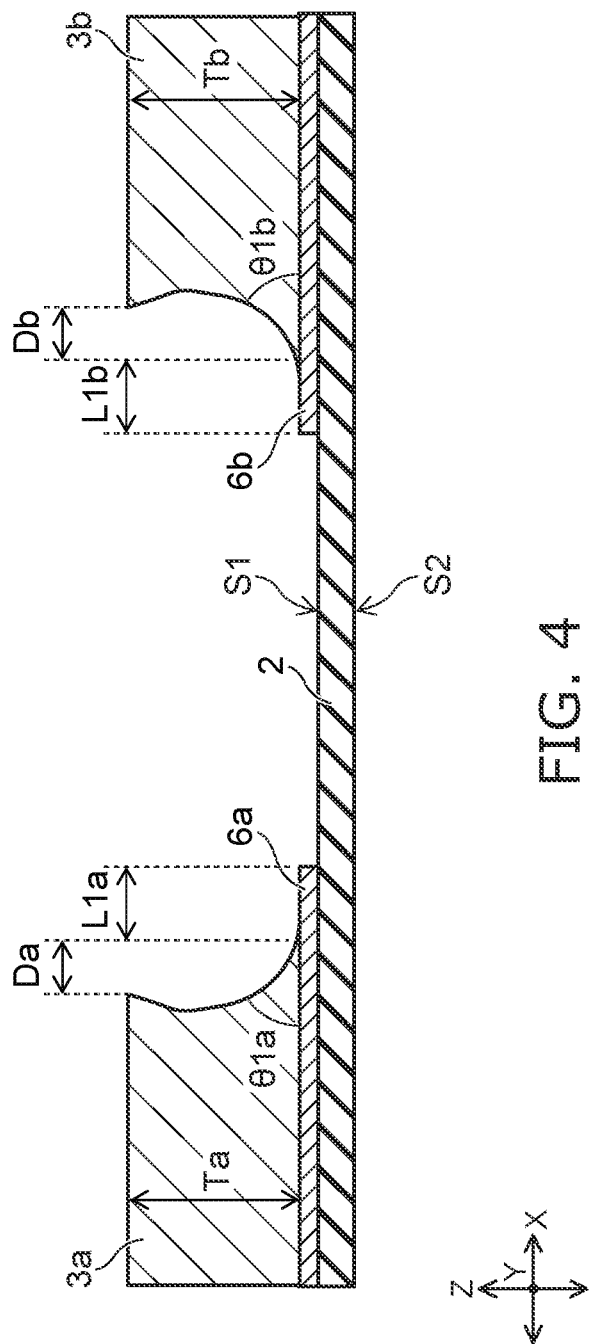
FIG. 4 is a schematic cross-sectional view showing another structure example of the side surface shapes of the first copper part and the second copper part.

It is favorable for the angle θ2a of the upper end portion of the first sloped portion to be 50° or more. It is favorable for the angle θ2b of the upper end portion of the second sloped portion to be 50° or more. FIGS. 3 and 4 are schematic cross-sectional views showing other structure examples of the side surface shapes of the first copper part and the second copper part. In FIGS. 3 and 4, components that are substantially similar to the components shown in FIGS. 1 and 2 are marked with the same reference numerals.

FIG. 2 illustrates a structure when the angle θ2a of the upper end portion of the first sloped portion is obtuse and the angle θ2b of the upper end portion of the second sloped portion is obtuse. FIG. 3 illustrates a structure when each upper end portion has a rounded shape. FIG. 4 illustrates a structure when the angle of each upper end portion is acute. In FIGS. 2 and 3, the angle of each upper end portion is 65° or more. In FIG. 4, the angle of each upper end portion is less than 50°. The SEM photograph (the magnification of 100 times) described above is used also when measuring the angle of each upper end portion. Here, obtuse means that the angle is not less than 90° but less than 180°. Acute means that the angle is less than 90°. A rounded shape means that a curved surface is observed at the corner of the upper end portion in a SEM photograph having a magnification of 100 times.

To increase the surface area where the semiconductor elements are mounted, it is favorable for the upper surface end portion of the first copper part and the upper surface end portion of the second copper part to be flat. Therefore, the structures illustrated in FIGS. 2 and 4 are favorable. Also, when each upper end portion has a rounded shape as illustrated in FIG. 3, it is desirable for the rounded shape to be gradual.

When resin-molding is performed, it is favorable for each upper end portion to have the shapes illustrated in FIGS. 2 and 3. Resin-molding is the process of sealing with a resin after the semiconductor elements are mounted. By resin-molding, the insulation properties can be improved, and the degradation due to moisture, etc., can be prevented. When the angle of each upper end portion is an acute angle that is less than 50° or even 45° or less, there is a possibility that the resin may not penetrate onto the first sloped portion and onto the second sloped portion. Bubbles form at locations to which the mold resin does not appropriately penetrate. Therefore, the yield of the resin-molding decreases. In recent years, mold processes such as transfer molding, etc., in which the suitability for mass production is excellent have been developed. In transfer molding, a method is used in which a resin is injected into a mold. Because the resin is caused to flow through the mold, it is favorable to use a structure in which small gaps do not easily form. Also, bubbles easily cause detachment of the mold resin when thermal stress is applied. When the mold resin detaches, this causes a conduction defect, an insulation defect, etc. Therefore, it is favorable for the angles θ2a and θ2b to be 50° or more, and more favorably 55° or more. More favorably, the angles θ2a and θ2b are 75° or more.

Figure 5A:
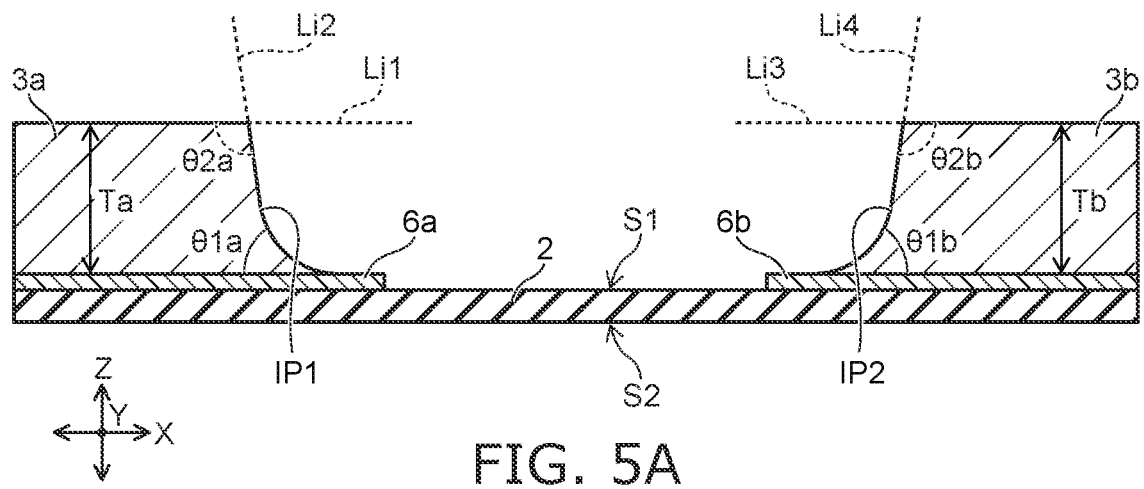
FIGS. 5A, 5B, and 5C are drawings showing a method for measuring the upper end portion of the first sloped portion and the angle of the upper end portion of the second sloped portion.
Figure 5B:
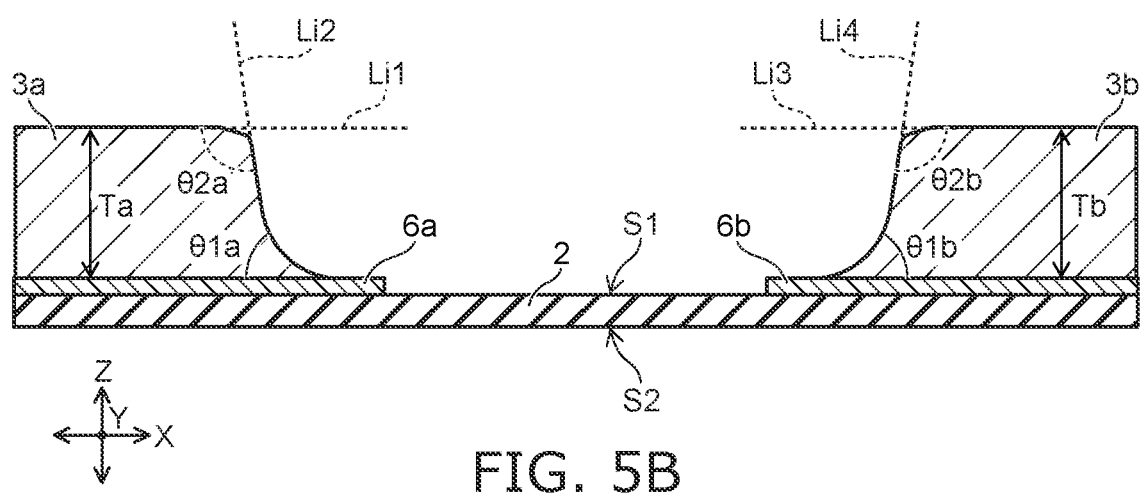
Figure 5C:
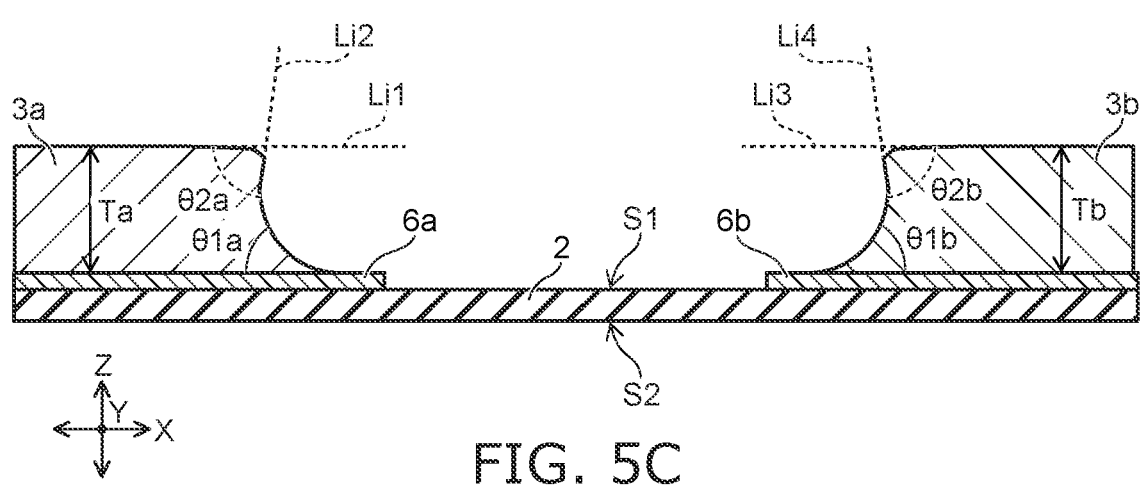

A method for measuring the angles θ2a and θ2b will now be described. FIGS. 5A, 5B, and 5C are drawings showing a method for measuring the upper end portion of the first sloped portion and the angle of the upper end portion of the second sloped portion. The angle θ2a is determined by calculating the angle at the point where a line Li1 and a line Li2 cross. The line Li1 is a line extending along the flat surface of the upper surface of the first copper part 3a in a SEM photograph of the cross section. The line Li2 is a line extending from the location at which the side surface of the first copper part 3a starts to slope downward (toward the ceramic substrate side). The angle θ2b is determined by calculating the angle at the point where a line Li3 and a line Li4 cross. The line Li3 is a line extending along the flat surface of the upper surface of the second copper part 3b in the SEM photograph of the cross section. The line Li4 is a line extending from the location at which the side surface of the second copper part 3b starts to slope downward (toward the ceramic substrate side).

FIG. 5A shows an example in which the upper end portion of the first sloped portion meets the upper surface of the first copper part. FIGS. 5B and 5C show examples in which the portion at which the upper surface of the first copper part and the upper end portion of the first sloped portion are connected has a rounded shape. In FIG. 5C, the first sloped portion is sloped to be slightly recessed inward. Specifically, in FIG. 5C, the first sloped portion is recessed inward in a circular arc-like configuration. A slight unevenness may be provided in the first sloped portion.

Figure 6:
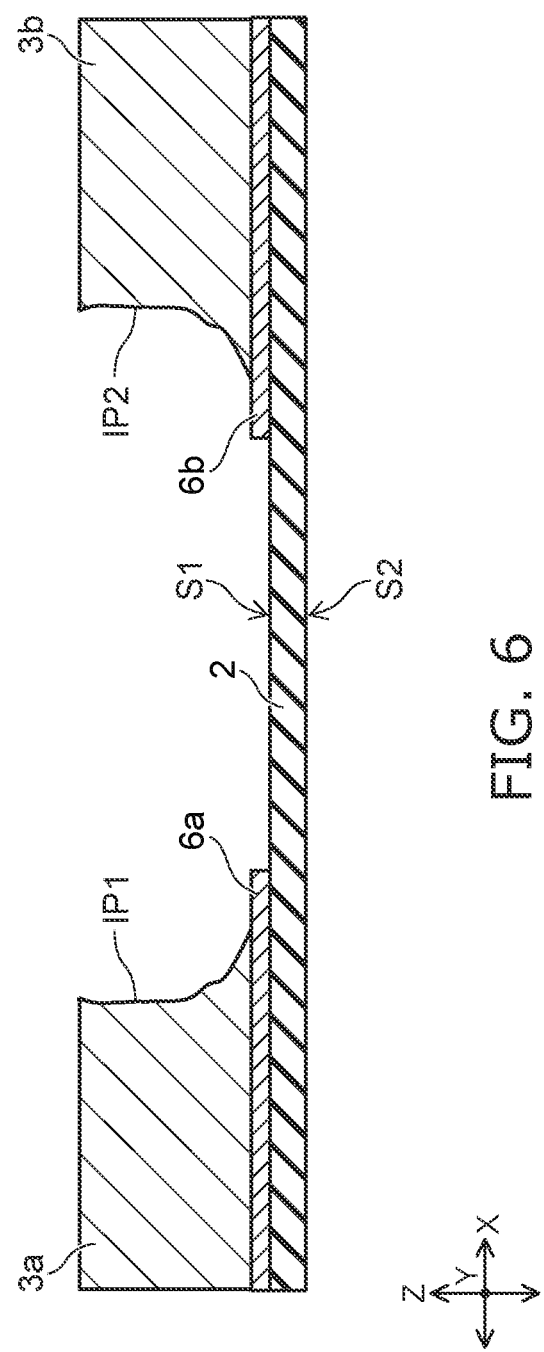
FIG. 6 is a schematic cross-sectional view showing another structure example of the side surface shapes of the first copper part and the second copper part.

FIG. 6 is a schematic cross-sectional view showing another structure example of the side surface shapes of the first copper part and the second copper part. FIG. 6 illustrates shapes in which unevennesses exist in the first sloped portion and the second sloped portion. In FIGS. 6, 2 is the ceramic substrate. 3a is the first copper part, and 3b is the second copper part. 5a is the first brazing material part, and 5b is the second brazing material part. IP1 is the first sloped portion, and IP2 is the second sloped portion. Small unevennesses are formed in the first sloped portion IP1 and the second sloped portion IP2 shown in FIG. 6. The existence or absence of the unevenness in each sloped portion can be confirmed using a cross section SEM photograph in which the side surface of the first copper part and the side surface of the second copper part are enlarged 1000 times. It is considered that an unevenness exists in each sloped portion when a micro unevenness is observed in the first sloped portion and the second sloped portion shown in an enlarged photograph (1000 times). It is favorable for the height difference between a protrusion and a recess that are adjacent to each other to be not less than 1 μm and not more than 20 μm. Also, it is favorable for multiple micro recesses and multiple micro protrusions to exist alternately. A micro wavy shape is formed when micro unevennesses are alternately provided.

Also, when the first sloped portion and the second sloped portion have shapes that start to slope by being recessed slightly inward, it is favorable for the width of the portion that is recessed inward to be not more than ¼ of the width of the first sloped portion or the width of the second sloped portion. Such a recessed structure is called a micro recessed configuration.

When a micro uneven configuration or a micro recessed configuration is provided, the adhesion between the mold resin and each copper part can be improved. That is, the TCT characteristics of the ceramic copper circuit board can be improved, and the adhesion between the ceramic copper circuit board and the mold resin can be improved. On the other hand, when the size of the uneven configuration and/or the recessed configuration is large, bubbles easily form between the mold resin and each copper part.

FIG. 7 are schematic plan views showing structure examples of the ceramic copper circuit board. FIG. 7A illustrates a structure in which a copper plate that includes the first copper part 3a and another copper plate that includes the second copper part 3b are bonded to the ceramic substrate 2. FIG. 7B illustrates a structure in which one copper plate that includes the first copper part 3a and the second copper part 3b is bonded to the ceramic substrate 2. In either structure as well, the first copper part and the second copper part are separated from each other in one horizontal direction along the bonding surface of the ceramic substrate. For example, the first sloped portion IP1 of the first copper part faces the second sloped portion IP2 of the second copper part in the one direction.

It is favorable for 90% or more of the side surface of the copper circuit board on which the semiconductor element is mounted to have the shapes described above. For example, multiple copper circuit boards on which the semiconductor elements are mounted are provided for the ceramic substrate. The first copper part is one of the multiple copper circuit boards. The second copper part is another one of the multiple copper circuit boards. Or, the first copper part may be a portion of one copper circuit board, and the second copper part may be another portion of the one copper circuit board. It is desirable for 90% or more of the side surface of the first copper part to have a shape similar to the first sloped portion described above. Also, it is desirable for 90% or more of the side surface of the second copper part to have a shape similar to the second sloped portion described above. Most favorably, the entire side surface of the first copper part has a shape similar to the first sloped portion, and the entire side surface of the second copper part has a shape similar to the second sloped portion.

A ceramic copper circuit board such as those described above has excellent TCT characteristics.

For example, in one cycle of TCT, holding for 30 minutes at −40° C., holding for 10 minutes at room temperature, holding for 30 minutes at 175° C., and holding for 10 minutes at room temperature are sequentially performed. The cycles are repeated, and the number of cycles at which a discrepancy occurs in the ceramic copper circuit board is measured. Discrepancies of the circuit board are, for example, detachment of the brazing material parts (5a and 5b), detachment of the brazing material layer 7, a crack of the ceramic substrate 2, etc.

The ceramic copper circuit board of the embodiment can have excellent TCT characteristics even when the high-temperature-side holding temperature of the TCT is 175° C. or more. A holding temperature that is 175° C. or more is, for example, 200° C. to 250° C. In a semiconductor element such as a SiC element, a GaN element, etc., the junction temperature is predicted to become 200 to 250° C. The junction temperature corresponds to the guaranteed operating temperature of the semiconductor element. Therefore, in the ceramic copper circuit board as well, durability at high temperatures is desirable.

Also, by controlling the width of each sloped portion and the length of each jutting portion, stress relaxation can be performed by a small jutting portion. Therefore, the spacing P between the first copper part and the second copper part can be made narrow, i.e., 2 mm or less, or even 1.5 mm or less.

Also, by controlling the shape of the upper end portion of each sloped portion, the mounting surface area of the semiconductor element and the improvement of the resin moldability can be ensured.

A method for manufacturing the ceramic copper circuit board according to the embodiment will now be described. As long as the ceramic copper circuit board according to the embodiment has the configuration described above, the ceramic copper circuit board is not limited to the following manufacturing method. For example, according to the following manufacturing method, the yield of the ceramic copper circuit board according to the embodiment can be increased.

First, a bonded body is prepared in which the first copper part and the second copper part are bonded to at least one surface of a ceramic substrate via a brazing material layer. The thickness of the first copper part and the thickness of the second copper part are 0.6 mm or more. The first copper part and the second copper part have circuit pattern shapes. The first copper part and the second copper part may be circuit patterns that are separated from each other or may be a portion of one circuit pattern. The first copper part and the second copper part are formed by etching one copper plate. Or, the first copper part and the second copper part may be formed by bonding, to the ceramic substrate, a copper plate that includes the first copper part and another copper plate that includes the second copper part. A method is favorable in which copper plates are bonded to two surfaces of the ceramic substrate, and the first copper part and the second copper part are formed by etching-patterning the copper plate of at least one surface. Bonding copper plates to two surfaces can suppress the occurrence of warp of the bonded body. Also, in the case where etching is used, it is possible to form any pattern shape. When viewed from above, the shapes of the first copper part and the second copper part are arbitrary, and various shapes such as, for example, square, rectangular, U-shaped, L-shaped, H-shaped, etc., may be used. The brazing material layer is provided between the first copper part and the second copper part.

The method for manufacturing the ceramic copper circuit board according to the embodiment includes a brazing material etching process and a copper etching process. The method for manufacturing the ceramic copper circuit board according to the embodiment may further include a preparation process and a circuit pattern formation process.

In the preparation process, a bonded body is prepared in which a copper plate having a thickness of 0.6 mm or more is bonded to at least one surface of the ceramic substrate via a brazing material layer. In the circuit pattern formation process, the copper plate is etched into a pattern shape. The first copper part and the second copper part are formed thereby. In the brazing material etching process, the brazing material layer that exists between the first copper part and the second copper part is etched. By etching the brazing material layer, the first brazing material part that is positioned between the ceramic substrate and the first copper part is formed, and the second brazing material part that is positioned between the ceramic substrate and the second copper part is formed. At this time, the etching is performed so that the length L2 of the removal region is within the range of ±100 μm from the end portion of the copper part. For example, the length of the removal region of the first brazing material part is the distance in a direction parallel to the ceramic substrate front surface between the end portion of the first copper part and the end portion of the first brazing material part most proximate to the end portion of the first copper part. The length of the removal region of the second brazing material part is the distance in a direction parallel to the ceramic substrate front surface between the end portion of the second copper part and the end portion of the second brazing material part most proximate to the end portion of the second copper part. In the copper etching process, the side surface of the first copper part and the side surface of the second copper part are etched. At this time, etching is performed so that the length L1a of the first jutting portion and the length L1b of the second jutting portion are within the range not less than 0 μm and not more than 200 μm, the contact angle θ1a between the first jutting portion and the first sloped portion and the contact angle θ1b between the second jutting portion and the second sloped portion are 65° or less, the width Da of the first sloped portion satisfies Da≤0.5Ta, and the width Db of the second sloped portion satisfies Db≤0.5Tb. Also, it is favorable for the length L1a of the first jutting portion and the length L1b of the second jutting portion to be greater than 0 μm.

Figure 8:
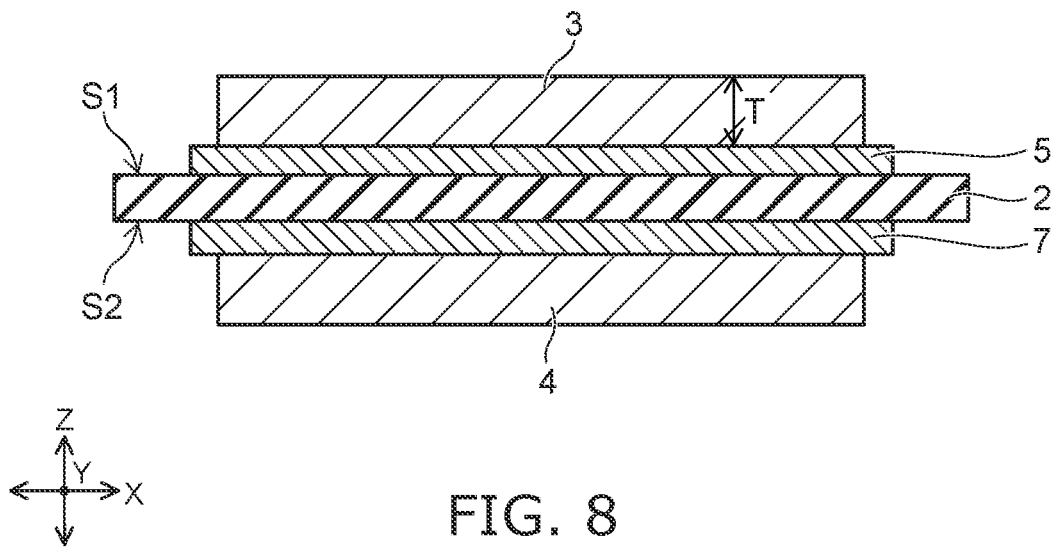
FIG. 8 is a schematic cross-sectional view showing a portion of the manufacturing processes of the ceramic copper circuit board.
Figure 9:
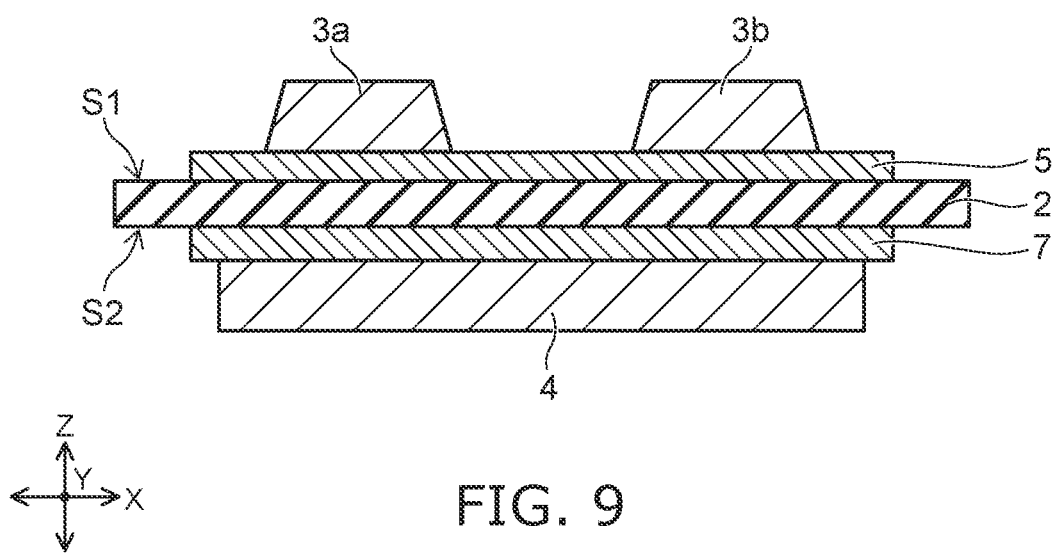
FIG. 9 is a schematic cross-sectional view showing a portion of the manufacturing processes of the ceramic copper circuit board.
Figure 10:
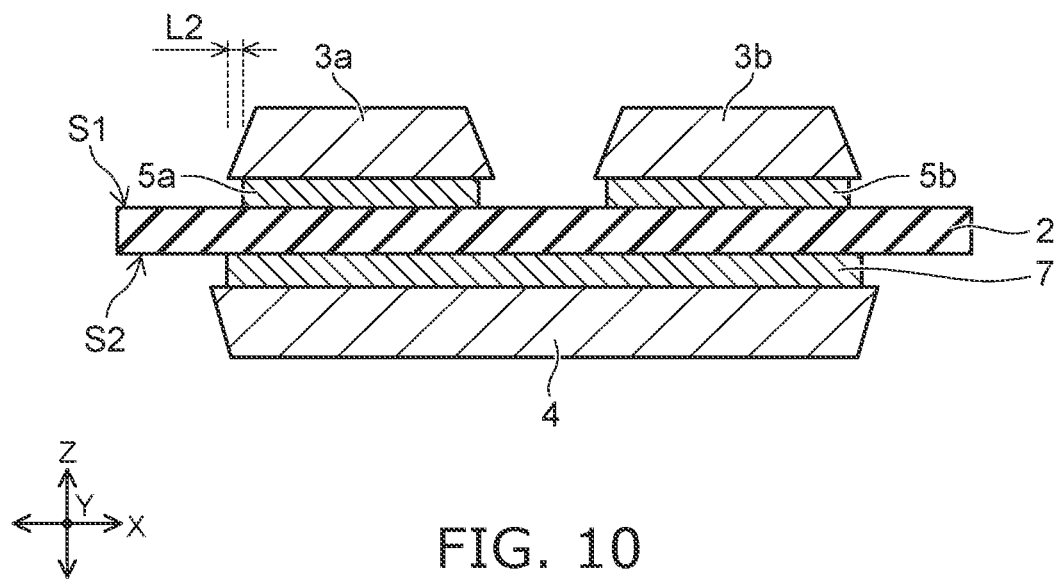
FIG. 10 is a schematic cross-sectional view showing a portion of the manufacturing processes of the ceramic copper circuit board.
Figure 11:
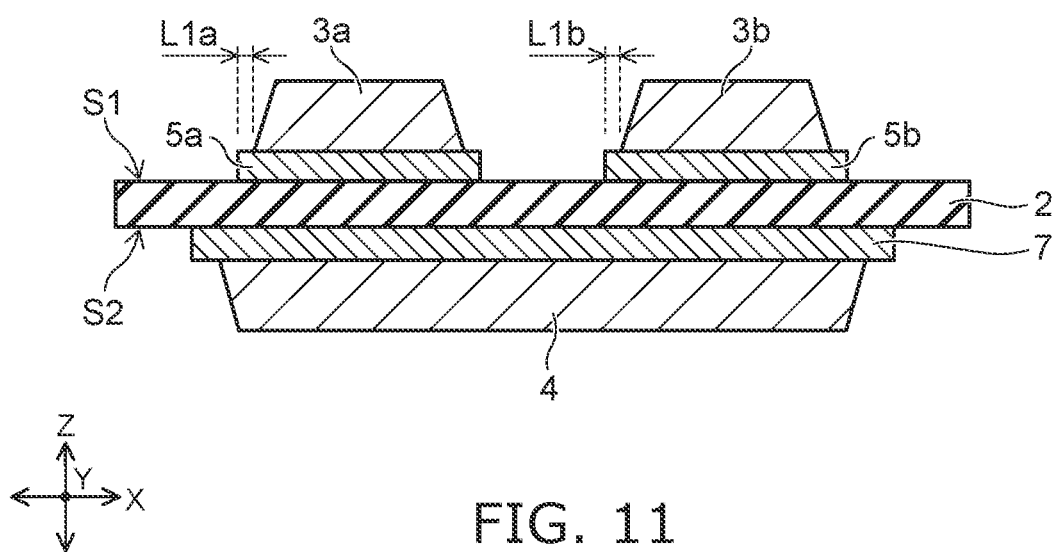
FIG. 11 is a schematic cross-sectional view showing a portion of the manufacturing processes of the ceramic copper circuit board.

FIGS. 8 to 11 are schematic cross-sectional views showing a portion of the manufacturing processes of the ceramic copper circuit board. FIGS. 8 to 11 illustrate the flow of the manufacturing processes of the ceramic copper circuit board. In FIGS. 8 to 11, components that are substantially similar to the components shown in FIGS. 1 and 2 are marked with the same reference numerals. L2 of FIG. 10 is the length of the removal region. In FIG. 8, a bonded body in which copper plates are bonded to two surfaces is described as an example. The bonded body of FIG. 8 is a bonded body that uses so-called blanket copper plates.

First, a preparation process of preparing the bonded body is performed. The bonded body has a copper plate having a thickness of 0.6 mm or more bonded to at least one surface of the ceramic substrate via a brazing material layer. The ceramic substrate and the copper plate are bonded using active metal bonding.

The ceramic substrate can include a silicon nitride substrate, an aluminum nitride substrate, an alumina substrate, a zirconia-including alumina substrate, etc. It is favorable for the three-point bending strength of the ceramic substrate 2 to be 500 MPa or more. It is favorable for the thickness T of the copper plate to be 0.6 mm or more. The thickness of a front copper plate 3 may be equal to or different from the thickness of the back copper plate 4. The warp of the bonded body is suppressed when the thickness of the front copper plate 3 and the thickness of the back copper plate 4 is the same. It is favorable for the lengthwise and crosswise size of the copper plate to be about 0.5 to 5 mm smaller than the ceramic substrate.

The brazing material layers 5 and 7 include a brazing material including Ag, Cu, and an active metal. One, two, or more selected from Sn, In, or C may be added to the brazing material as necessary. The bonding process is performed at a temperature of 700 to 880° C. in a vacuum (10-2 Pa or less).

A bonded body of a ceramic substrate and a copper plate such as that shown in FIG. 8 is made by this process.

Then, a circuit pattern formation process of etching the copper plate into a pattern shape is performed. In this process, a circuit pattern is formed in the copper plate of the bonded body (the bonded body of the ceramic substrate and the copper plate). Here, an example is described in which a circuit pattern is formed in the front copper plate. When a circuit pattern is formed in the back copper plate as well, a similar process is performed also for the back copper plate.

First, an etching resist is coated onto the portion of the front copper plate 3 that will remain as the circuit pattern. Subsequently, the copper plate is etched. It is favorable to use iron chloride or copper chloride in the etching process of the copper plate. It is favorable for the iron chloride to be FeCl3. It is favorable for the copper chloride to be CuCl2. An etchant that includes iron chloride or copper chloride can selectively etch the copper plate. In other words, the active metal brazing material layer can remain substantially without being etched. By this process, the copper plate 3 is etched as shown in FIG. 9, and the first copper part 3a and the second copper part 3b are formed. At this time, the etching is performed so that the first sloped portion is formed in the side surface of the first copper part 3a, and the second sloped portion is formed in the side surface of the second copper part 3b.

In this process, it is favorable to set the distance P between the first copper part 3a and the second copper part 3b to be in the range of 0 μm to −200 μm with respect to the final distance P between the first copper part 3a and the second copper part 3b by considering the length of the jutting portion formed in a subsequent process. For example, when the final distance P between the first copper part 3a and the second copper part 3b is 1.5 mm, it is favorable to set the distance P in the circuit pattern formation process to be within the range of 1.5 to 1.3 mm. That is, it is favorable to preset the distance P directly after the circuit pattern formation process to be equal to the final distance P or not more than 200 μm smaller than the final distance P. Also, etching is performed so that the width Da of the first sloped portion and the thickness Ta of the first copper part satisfy Da≤ (0.5Ta+100 μm) and the width Db of the second sloped portion and the thickness Tb of the second copper part satisfies Db≤(0.5Tb+100 μm). By controlling the shape beforehand as described above in the circuit pattern formation process, the shape control in the subsequent processes becomes easy.

Although FIG. 9 shows an example in which the copper plate is patternized into two (the first copper part and the second copper part), the pattern shape that is formed is modifiable as appropriate. Also, in this process as shown in FIG. 9, a portion of a brazing material layer 5 exists between the first copper part 3a and the second copper part 3b. The portion of the brazing material layer 5 is not covered with the copper parts and is exposed.

Then, a brazing material etching process is performed. In the brazing material etching process, the length L2 of the removal region is caused to be within the range of ±100 μm of the copper part end portion by etching the brazing material layer existing between the first copper part and the second copper part. Due to the brazing material etching process, the brazing material that is between the ceramic substrate and the first copper part is electrically isolated from the brazing material between the ceramic substrate and the second copper part.

In the brazing material etching process, the brazing material layer is etched using aqueous hydrogen peroxide, an ammonium compound, etc. A brazing material etchant that includes aqueous hydrogen peroxide, an ammonium compound, or the like is effective when the brazing material layer is an active metal brazing material that includes Ag, Cu, and an active metal, etc. Such a brazing material etchant can selectively etch the active metal brazing material layer. Also, the brazing material etchant may include a component other than aqueous hydrogen peroxide or an ammonium compound as necessary. Also, the brazing material etchant may include a mixed liquid of aqueous hydrogen peroxide and an ammonium compound.

The brazing material layer is etched so that the length L2 of the removal region is within the range of ±100 μm. The length L2 of the removal region is the distance between one end of the copper part and one end of the brazing material part. By setting the length L2 of the removal region to be within the range described above, the shape control in the subsequent processes becomes easy.

The state in which one end of the copper part overlaps one end of the brazing material part in the Z-direction corresponds to the state in which the jutting portion length L1 is 0 μm. The state in which the length L2 of the removal region is ±100 μm corresponds to the state in which the jutting portion length L1 is within the range of ±100 μm. A negative length L2 of the removal region means that the brazing material part is positioned further inward than the copper part end portion. In other words, this means that the brazing material part does not jut from the copper part end portion. Also, a positive length L2 of the removal region means that the brazing material part is positioned outward of the copper part end portion. In other words, this means that the brazing material part juts from the copper part end portion. That is, the length L2 of the removal region being −100 μm is the state in which the brazing material is removed in the range of 100 μm inward of the copper part end portion. Also, the length L2 of the removal region being +100 μm is the state in which the jutting portion is formed 100 μm outward of the copper part end portion.

Also, it is favorable for the length L2 of the removal region to be in the range of −50 μm to +30 μm. The jutting portion length L1 that is favorable for ensuring the insulation distance is not less than 10 μm and not more than 100 μm. The jutting portion length L1 is controlled easily in subsequent processes by setting the length L2 of the removal region to be ±100 μm, and more easily within the range of −50 μm to +30 μm.

Then, a copper etching process of etching the side surface of the first copper part and the side surface of the second copper part is performed. In this process, the etching is performed so that the length L1a of the first jutting portion and the length L1b of the second jutting portion are in the range not less than 0 μm and not more than 200 μm, the contact angle θ1a between the first jutting portion and the first sloped portion is 65° or less, the contact angle θ1b between the second jutting portion and the second sloped portion is 65° or less, the width of the first sloped portion is not more than 0.5 times the thickness of the first copper part, and the width of the second sloped portion is not more than 0.5 times the thickness of the second copper part.

By using a liquid to etch the copper, the length of each jutting portion can be controlled by etching the side surface of the first copper part and the side surface of the second copper part. Also, the contact angle θ1a, the contact angle θ1b, the angle θ2a of the upper end portion of the first sloped portion, and the angle θ2b of the upper end portion of the second sloped portion can be controlled by etching the side surface of the first copper part and the side surface of the second copper part. Also, when it is desirable not to etch a region of the upper surface or the side surface of the first copper part or the second copper part, it is effective to use a resist beforehand that is resistant to the etchant (a mixed liquid of aqueous hydrogen peroxide and an ammonium compound, etc.) used in the process of etching the brazing material layer. It is also effective to newly coat a resist in the region that is not to be etched after the process of etching the brazing material layer.

Also, the etching conditions of the side surface of the first copper part and the side surface of the second copper part are such that the shape of the ceramic copper circuit board according to the embodiment described above is satisfied. That is, the etching is performed so that the width of the first sloped portion, the width of the second sloped portion, the length of the first jutting portion, the length of the second jutting portion, the shape of the first sloped portion, and the shape of the second sloped portion are similar to those of the configuration of the ceramic copper circuit board according to the embodiment described above.

It is favorable for the side surface of the first copper part and the side surface of the second copper part to be etched using conditions such that the etching rate of the first and second copper parts is 100 μm or less in one etching process. The etching rate is the amount that each copper part is etched in one etching process. The etching rate is calculated from "the thickness of the copper part before the etching—the thickness of the copper part after the etching". The etchant for the copper part includes iron chloride or copper chloride. It is favorable for the conditions of one etching process to provide an etching rate of 100 μm or less in 1 to 10 minutes. Also, it is favorable for the etching rate to be 40 to 60 μm. It is favorable for the etching time to be within the range of 1 to 4 minutes. When the etching rate is less than 40 μm, the etching time lengthens, and the suitability for mass production decreases. Also, when the etching rate is large and is greater than 100 μm, the control of the shape of the first sloped portion and the shape of the second sloped portion becomes difficult.

Also, a chemical polishing liquid that is a mixed liquid of sulfuric acid and hydrogen peroxide can be used as the etchant for the copper part. However, generally, the etching rate of a chemical polishing liquid is less than the etching rate of an etchant using iron chloride or copper chloride. That is, when performing etching for the same amount of time, the etching amount is higher for a copper plate etchant using iron chloride or copper chloride. The suitability for mass production decreases as the etching time lengthens. Therefore, it is favorable to use iron chloride or copper chloride as the etchant.

The same etchant can be used in the circuit pattern formation process and the copper etching process. When the same etchant is used in the circuit pattern formation process and the copper etching process, it is favorable for the etching time of the copper etching process to be less than the etching time of the circuit pattern formation process. By using the same etchant, the etching rate can be controlled using the time.

In the ceramic copper circuit board according to the embodiment, the copper plate thickness T is 0.6 mm or more. It is favorable for the etching rate of one etching process to be 100 μm or less, and more favorably 40 to 60 μm. Also, it is favorable for the etching time to be 1 to 10 minutes, and more favorably 1 to 4 minutes. By using such conditions, the suitability for mass production also can be improved with a high yield and with control of the shape. Also, the brazing material layer etching and the copper etching process may be performed alternately multiple times. Thereby, the width of each sloped portion, the length of each jutting portion, and each contact angle are easily controlled to be within the ranges described above.

An example is described above in which both the length L1a and the length L1b of the ceramic copper circuit board are not less than 0 μm and not more than 200 μm. Only one of the length L1a or the length L1b may be not less than 0 μm and not more than 200 μm. To further relax the thermal stress, it is desirable for both the length L1a and the length L1b to be not less than 0 μm and not more than 200 μm.

Also, only one of the contact angle θ1a or the contact angle θ1b may be 65° or less. However, to further relax the thermal stress, it is favorable for both the contact angle θ1a and the contact angle θ1b to be 65° or less.

Also, only one of the width Da being not more than 0.5 times the thickness Ta or the width Db being not more than 0.5 times the thickness Tb may be satisfied. However, to further increase the mounting area of the semiconductor element, it is favorable for both the width Da being not more than 0.5 times the thickness Ta and the width Db being not more than 0.5 times the thickness Tb to be satisfied.

Also, only one of the angle θ2a or the angle θ2b may be 50° or more. However, to further improve the resin moldability, it is favorable for both the angle θ2a and the angle θ2b to be 50° or more.

EXAMPLES

Examples 1 to 15 and Comparative Examples 1 to 2

Bonded bodies of the ceramic substrate and the copper plate were prepared as shown in Table 1. For the ceramic substrate, a silicon nitride substrate (having a thermal conductivity of 90 W/(m·K) and a three-point bending strength of 650 MPa) that was 60 mm long×50 mm wide×0.32 mm thick was used as a first silicon nitride substrate. Also, a silicon nitride substrate (having a thermal conductivity of 85 W/(m·K) and a three-point bending strength of 700 MPa) that was 60 mm long×50 mm wide×0.25 mm thick was used as a second silicon nitride substrate. Also, an aluminum nitride substrate (having a thermal conductivity of 170 W/(m·K) and a three-point bending strength of 400 MPa) that was 60 mm long×50 mm wide×0.635 mm thick was prepared. Also, the copper plate was oxygen-free copper that was 55 mm long×45 mm wide. The bonding method was bonding by active metal bonding. Also, a copper plate that had the same size front and back was bonded.

removal regions in Table 2 that are listed as negative show how much the brazing material layer is removed from the copper part end portion.

Also, in a comparative example 1, the brazing material layer greatly juts. In a comparative example 2, the length L2 of the removal region is large.

TABLE 2

| BONDED BODY | REMOVAL REGION LENGTH L2 (μM) |
|---|---|---|
| EXAMPLE 1 | BONDED BODY 1 | 0 |
| EXAMPLE 2 | BONDED BODY 1 | −50 |
| EXAMPLE 3 | BONDED BODY 1 | −100 |
| EXAMPLE 4 | BONDED BODY 1 | +60 |
| EXAMPLE 5 | BONDED BODY 2 | 0 |
| EXAMPLE 6 | BONDED BODY 2 | −50 |
| EXAMPLE 7 | BONDED BODY 2 | −100 |
| EXAMPLE 8 | BONDED BODY 2 | +50 |
| EXAMPLE 9 | BONDED BODY 3 | 0 |
| EXAMPLE 10 | BONDED BODY 3 | −50 |
| EXAMPLE 11 | BONDED BODY 3 | −100 |
| EXAMPLE 12 | BONDED BODY 3 | +30 |
| EXAMPLE 13 | BONDED BODY 4 | −60 |
| EXAMPLE 14 | BONDED BODY 4 | −90 |
| EXAMPLE 15 | BONDED BODY 5 | −80 |
| EXAMPLE 16 | BONDED BODY 6 | +20 |
| EXAMPLE 17 | BONDED BODY 6 | −100 |
| COMPARATIVE EXAMPLE 1 | BONDED BODY 1 | +200 |

TABLE 1

| | SILICON NITRIDE SUBSTRATE | COPPER PLATE THICKNESS T(mm) | BRAZING MATERIAL LAYER | |
|---|---|---|---|---|
| | | | THICKNESS (μm) | COMPONENTS (wt %) |
| BONDED BODY 1 | FIRST SILICON NITRIDE SUBSTRATE | 0.6 | 30 | Ag (57)—Cu (30)—Sn(10)—Ti (3) |
| BONDED BODY 2 | FIRST SILICON NITRIDE SUBSTRATE | 0.8 | 40 | Ag (49.7)—Cu (30)—Sn (12)—Ti (8)—C (0.3) |
| BONDED BODY 3 | FIRST SILICON NITRIDE SUBSTRATE | 1.0 | 45 | Ag (48.8)—Cu (35)—Sn (10)—Ti (6)—C (0.2) |
| BONDED BODY 4 | SECOND SILICON NITRIDE SUBSTRATE | 0.9 | 35 | Ag (49.7)—Cu (30)—Sn (12)—Ti (8)—C (0.3) |
| BONDED BODY 5 | SECOND SILICON NITRIDE SUBSTRATE | 1.0 | 45 | Ag (48.8)—Cu (35)—Sn (10)—Ti (6)—C (0.2) |
| BONDED BODY 6 | SECOND SILICON NITRIDE SUBSTRATE | 0.6 | 40 | Ag (57)—Cu (30)—Sn (10)—Ti (3) |

Then, an etching resist was coated onto the front copper plate of the bonded body. The etching resist was a commercial resist that can withstand the liquid used to etch the brazing material layer, and was coated in a pattern shape. The design was such that the spacing between the patterns after etching the copper plate was 1.0 mm.

Then, the copper plate was etched. One copper plate was subdivided into multiple copper parts corresponding to the circuit pattern by the etching. The distance P between the adjacent copper parts was 1.0 mm. Also, the etching was performed so that a width D of the sloped portion of the copper part side surface and the thickness T of the copper part satisfied D≤(0.5T+100 μm). Also, the brazing material layer was exposed between the adjacent copper parts.

Then, the brazing material layer was etched. The etching of the brazing material layer was performed to prepare bonded bodies having the lengths L2 of the removal regions of Table 2. In the examples, the length L2 of the removal region was in the range of ±100 μm. The lengths L2 of the TABLE 2-continued

| | BONDED BODY | REMOVAL REGION LENGTH L2 (μM) |
|---|---|---|
| COMPARATIVE EXAMPLE 2 | BONDED BODY 1 | −300 |
| COMPARATIVE EXAMPLE 3 | BONDED BODY 6 | −300 |

Then, an etching process of the copper part side surface was performed for the ceramic copper circuit boards according to the examples and the comparative examples. Ceramic copper circuit boards that had the shapes of Table 3 were made thereby. The copper etching process used a ferric chloride solution for an etching time 3 minutes to provide an etching rate 60 μm. Also, the etching amount was controlled by adjusting the times of the circuit pattern formation process and the copper etching process.

TABLE 3

|  | SLOPED PORTION WIDTH D (mm) | D ≤ 0.5 T | JUTTING PORTION LENGTH L1 (μm) | CONTACT ANGLE θ1 (°) | SLOPED PORTION UPPER END PORTION ANGLE θ2 (°) |
|---|---|---|---|---|---|
| EXAMPLE 1 | 0.15 | D ≤ 0.3 | 84 | 30 | 84 |
| EXAMPLE 2 | 0.15 | D ≤ 0.3 | 45 | 40 | 79 |
| EXAMPLE 3 | 0.1 | D ≤ 0.3 | 28 | 60 | 55 |
| EXAMPLE 4 | 0.2 | D ≤ 0.3 | 150 | 20 | 95 |
| EXAMPLE 5 | 0.25 | D ≤ 0.4 | 81 | 20 | 93 |
| EXAMPLE 6 | 0.2 | D ≤ 0.4 | 66 | 40 | 89 |
| EXAMPLE 7 | 0.15 | D ≤ 0.4 | 31 | 50 | 68 |
| EXAMPLE 8 | 0.3 | D ≤ 0.4 | 110 | 15 | 99 |
| EXAMPLE 9 | 0.3 | D ≤ 0.4 | 78 | 10 | 103 |
| EXAMPLE 10 | 0.25 | D ≤ 0.5 | 57 | 30 | 92 |
| EXAMPLE 11 | 0.2 | D ≤ 0.5 | 43 | 40 | 81 |
| EXAMPLE 12 | 0.4 | D ≤ 0.5 | 95 | 5 | 108 |
| EXAMPLE 13 | 0.2 | D ≤ 0.4 | 53 | 35 | 85 |
| EXAMPLE 14 | 0.3 | D ≤ 0.4 | 65 | 40 | 85 |
| EXAMPLE 15 | 0.4 | D ≤ 0.5 | 75 | 45 | 95 |
| EXAMPLE 16 | 0.1 | D ≤ 0.3 | 120 | 50 | 75 |
| EXAMPLE 17 | 0.2 | D ≤ 0.3 | 70 | 55 | 85 |
| COMPARATIVE EXAMPLE 1 | 0.43 | D ≤ 0.3 | +330 | 80 | 70 |
| COMPARATIVE EXAMPLE 2 | 0.15 | D ≤ 0.3 | −165 | 50 | 45 |
| COMPARATIVE EXAMPLE 3 | 0.1 | D ≤ 0.1 | 50 | 80 | 50 |

In the ceramic copper circuit boards according to the examples, the width of the sloped portion, the length of the jutting portion, the contact angle, the angle of the sloped portion upper end portion, etc., were in the desirable ranges. Also, a micro uneven configuration that was not less than 1 μm and not more than 20 μm or a micro recessed configuration that was not more than ¼ of the width D was observed in the sloped portion for the ceramic copper circuit boards according to the examples.

Also, in the comparative example 1, the width D of the sloped portion was large, and the length L1 of the jutting portion also was undesirably large. Even when etching-patterning of the copper plate side surface was performed after pre-forming the jutting portion, it was difficult to pattern into the target shape. Also, when the length L2 of the removal region was increased as in the comparative example 2, it was difficult to pattern into the target shape even when etching-patterning of the copper plate side surface was performed.

The TCT test and the resin moldability were verified for the ceramic copper circuit boards according to the examples and the comparative examples.

One cycle of the TCT test was set to hold at −40° C.×30 minutes→hold at room temperature×10 minutes→hold at 250° C.×30 minutes→hold at room temperature×10 minutes. For the silicon nitride copper circuit boards, the existence or absence of the occurrence of discrepancies in the ceramic copper circuit board after 3000 cycles was verified. Also, for the aluminum nitride copper circuit board, the existence or absence of the occurrence of discrepancies in the ceramic copper circuit board after 2000 cycles was verified. For the existence or absence of the occurrence of discrepancies, the existence or absence of cracks between the ceramic substrate and the copper part was verified using ultrasonic test equipment (SAT). The state of cracks not being observed is notated as good, and cracks being observed is notated as no good.

Also, for the resin moldability, a semiconductor module that was resin-molded by transfer molding was made. The existence or absence of bubbles at the copper part side surface of the semiconductor module was observed. The existence or absence of bubbles was performed by CT observation. Bubbles being not more than 2% of the copper part side surface by area ratio is displayed as good, and being greater than 2% is displayed as no good.

The results are shown in Table 4.

TABLE 4

|  | TCT TEST | RESIN MOLDABILITY |
|---|---|---|
| EXAMPLE 1 | GOOD | GOOD |
| EXAMPLE 2 | GOOD | GOOD |
| EXAMPLE 3 | GOOD | NO GOOD |
| EXAMPLE 4 | GOOD | GOOD |
| EXAMPLE 5 | GOOD | GOOD |
| EXAMPLE 6 | GOOD | GOOD |
| EXAMPLE 7 | GOOD | GOOD |
| EXAMPLE 8 | GOOD | GOOD |
| EXAMPLE 9 | GOOD | GOOD |
| EXAMPLE 10 | GOOD | GOOD |
| EXAMPLE 11 | GOOD | GOOD |
| EXAMPLE 12 | GOOD | GOOD |
| EXAMPLE 13 | GOOD | GOOD |
| EXAMPLE 14 | GOOD | GOOD |
| EXAMPLE 15 | GOOD | GOOD |
| EXAMPLE 16 | GOOD | GOOD |
| EXAMPLE 17 | GOOD | GOOD |
| COMPARATIVE EXAMPLE 1 | NO GOOD | GOOD |
| COMPARATIVE EXAMPLE 2 | NO GOOD | NO GOOD |
| COMPARATIVE EXAMPLE 3 | NO GOOD | NO GOOD |

It can be seen from the Table that the ceramic copper circuit boards according to the examples had excellent TCT characteristics. Also, the TCT characteristics were good even when the thickness of the ceramic substrate was thin, i.e., 0.25 mm, as in the examples 13 to 15.

On the other hand, the TCT characteristics degraded when a contact angle θ1 between the jutting portion and the sloped portion of the copper part side surface was large, i.e., 80°, as in the comparative example 1 and the comparative example 3. The TCT characteristics of the comparative example 2 degraded because the jutting portion length L1 was −100 µm.

Also, the resin moldability was good when an angle θ2 of the upper end portion of the sloped portion was 55° or more. For less than 65° as in the example 1 and the comparative example 2, bubbles formed easily.

Also, conduction defects occurred more easily when the jutting portion length L1 was large, i.e., greater than 200 µm, as in the comparative example 1. Therefore, it is difficult to reduce the distance P between the copper parts.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A ceramic copper circuit board, comprising:
   a ceramic substrate; and
   a first copper part bonded to a first surface of the ceramic substrate via a first brazing material part,
   a thickness of the first copper part being 0.6 mm or more,
   a side surface of the first copper part including a first sloped portion,
   a width of the first sloped portion being not more than 0.5 times the thickness of the first copper part,
   the first brazing material part including a first jutting portion jutting from an end portion of the first sloped portion,
   a length of the first jutting portion being not less than 0 µm and not more than 200 µm,
   a contact angle between the first jutting portion and the first sloped portion being not less than 5° and not more than 65°, and
   an angle of an upper end portion of the first sloped portion being less than 50°.

2. The ceramic copper circuit board according to claim 1, wherein
   the contact angle is not more than 60°.

3. The ceramic copper circuit board according to claim 1, wherein
   the length of the first jutting portion is greater than 0 µm and not more than 200 µm.

4. The ceramic copper circuit board according to claim 1, wherein
   the first brazing material part includes silver, copper, and an active metal.

5. The ceramic copper circuit board according to claim 1, wherein
   the thickness of the first copper part is 0.8 mm or more,
   the ceramic substrate is a silicon nitride substrate, and
   a thickness of the ceramic substrate is 0.4 mm or less.

6. The ceramic copper circuit board according to claim 1, further comprising:
   a second copper part bonded to the first surface via a second brazing material part,
   the second copper part being separated from the first copper part in a first direction along the first surface,
   a distance in the first direction between at least a portion of the first copper part and at least a portion of the second copper part being 2 mm or less.

7. The ceramic copper circuit board according to claim 1, wherein
   the contact angle is not less than 5° and not more than 60°,
   the length of the first jutting portion is greater than 0 µm and not more than 200 µm,
   the thickness of the first copper part is 0.8 mm or more,
   the ceramic substrate is a silicon nitride substrate, and
   a thickness of the ceramic substrate is 0.4 mm or less.

8. The ceramic copper circuit board according to claim 1, wherein
   the length of the first jutting portion is greater than 40 µm and not more than 200 µm.

* * * * *